US006653185B2

(12) United States Patent
Gutsche et al.

(10) Patent No.: US 6,653,185 B2
(45) Date of Patent: Nov. 25, 2003

(54) METHOD OF PROVIDING TRENCH WALLS BY USING TWO-STEP ETCHING PROCESSES

(75) Inventors: Martin Gutsche, Dorfen (DE); Harald Seidl, Aschheim (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/103,009

(22) Filed: Mar. 21, 2002

(65) Prior Publication Data

US 2002/0149011 A1 Oct. 17, 2002

(30) Foreign Application Priority Data

Mar. 27, 2001 (DE) .......................................... 101 14 956

(51) Int. Cl.[7] ...................... H01L 21/8242; H01L 21/20
(52) U.S. Cl. ...................... 438/243; 438/386; 257/301
(58) Field of Search .................................. 438/238, 240, 438/242, 245, 396, 769, 243, 386, 247, 301

(56) References Cited

U.S. PATENT DOCUMENTS

| | | | |
|---|---|---|---|
| 3,663,870 A | | 5/1972 | Tsutsumi et al. |
| 4,495,219 A | | 1/1985 | Kato et al. |
| 5,395,786 A | * | 3/1995 | Hsu et al. .................... 438/248 |
| 5,744,386 A | * | 4/1998 | Kenney ....................... 438/245 |
| 5,770,878 A | | 6/1998 | Beasom |
| 5,776,621 A | | 7/1998 | Nashimoto |
| 5,827,765 A | | 10/1998 | Stengl et al. |
| 5,923,056 A | | 7/1999 | Lee et al. |
| 6,319,766 B1 | * | 11/2001 | Bakli et al. .................. 438/240 |
| 6,323,078 B1 | * | 11/2001 | Bhowmik et al. ........... 438/238 |
| 6,348,420 B1 | * | 2/2002 | Raaijmakers et al. ....... 438/769 |

FOREIGN PATENT DOCUMENTS

| | | |
|---|---|---|
| EP | 1 001 468 | 5/2000 |
| EP | 1 003 206 | 5/2000 |
| EP | 1 005 073 | 5/2000 |
| WO | WO 00/75984 | 12/2000 |

OTHER PUBLICATIONS

Patent Abstracts of Japan—Pub. No. 62136035 A–Jun. 19, 1987.
J. Journal—Tech. Phys, Lett. (USA Technical Physics Letters, vol. 23, No. 6, TPLEED Rozhkov et al.
5913503—J Journal Recombination properties of silicon passivated with rare–earth oxide films—Petrov et al.
6490130 CA Conference Article Device and reliability of high–k A1203 gate dielectric with good mobility and low Dit Chin et al.

* cited by examiner

Primary Examiner—David Nelms
Assistant Examiner—Long Tran
(74) Attorney, Agent, or Firm—Schiff Hardin & Waite

(57) ABSTRACT

Method of providing trench walls of a uniform orientation to support epitaxial growth in the trench. The trench is formed by a first etching process. A second etching process is used to change crystal orientation and thus create a widened trench with modified trench walls having a predetermined crystal orientation

11 Claims, 1 Drawing Sheet

METHOD OF PROVIDING TRENCH WALLS BY USING TWO-STEP ETCHING PROCESSES

BACKGROUND OF THE INVENTION

The present invention relates to a semiconductor component having, in, or on, a substrate and a dielectric layer provided on the substrate. The invention likewise relates to a corresponding fabrication method.

The term substrate is intended to be understood in the general sense and can therefore encompass both single-layer and multilayer substrates.

Although applicable to any desired semiconductor components, the present invention and the problem area on which it is based will be explained with regard to capacitors in silicon technology.

So-called one-transistor cells are used in dynamic random access memories (DRAMs). The cells comprise a storage capacitor and a selection transistor which connects the storage electrode to the bit line. The storage capacitor can be designed as a trench capacitor or as a stacked capacitor. The invention described here relates quite generally to capacitors for such DRAMs in the form of trench capacitors and stacked capacitors.

It is known to fabricate such a capacitor, e.g. for a DRAM (dynamic random access memory), with the construction electrode layer/insulator layer/electrode layer, in which case the electrode layers may be metal layers or (poly)silicon layers.

In order to further increase the storage density for future technology generations, the feature size is reduced from generation to generation. The ever decreasing capacitor area and the resultant decreasing capacitor capacitance lead to problems. Therefore, it is important for the capacitor capacitance at least to be kept constant despite a smaller feature size. This can be achieved, inter alia, by increasing the surface charge density of the storage capacitor.

Previously, this problem has been solved on the one hand by enlarging the available capacitor area (for a predetermined feature size). This can be achieved, e.g. by depositing polysilicon with a rough surface ("HSG") in the trench or onto the bottom electrode of the stacked capacitor. On the other hand, the surface charge density has previously been increased by reducing the thickness of the dielectric. In this case, exclusively various combinations of $SiO_2$ (silicon oxide) and $Si_3N_4$ (silicon nitride) have previously been used as dielectric for DRAM capacitors.

A few materials having a higher dielectric constant have furthermore been proposed for stacked capacitors. These explicitly include $Ta_2O_5$ and BST (barium strontium titanate). However, these materials are not thermostable in direct contact with silicon or polysilicon. Moreover, they are only inadequately thermostable.

SUMMARY OF THE INVENTION

An object of the present invention is to specify an improved semiconductor component and a corresponding fabrication method of the type mentioned in the introduction which yield a thermostable dielectric.

In a semiconductor component of the invention, a substrate is provided. A dielectric layer is provided on the substrate. The dielectric layer comprises a binary metal oxide.

In a method of the invention, a semiconductor component is fabricated by providing a substrate. A dielectric layer is provided on the substrate by first depositing a metal onto the substrate and then oxidizing the metal in a thermal process so that the dielectric layer comprises a binary metal oxide.

One of the exemplary embodiments of the invention is illustrated in the drawings and is explained in more detail in the description below.

DESCRIPTION OF THE PREFERRED EMBODIMENTS

Figure 1:
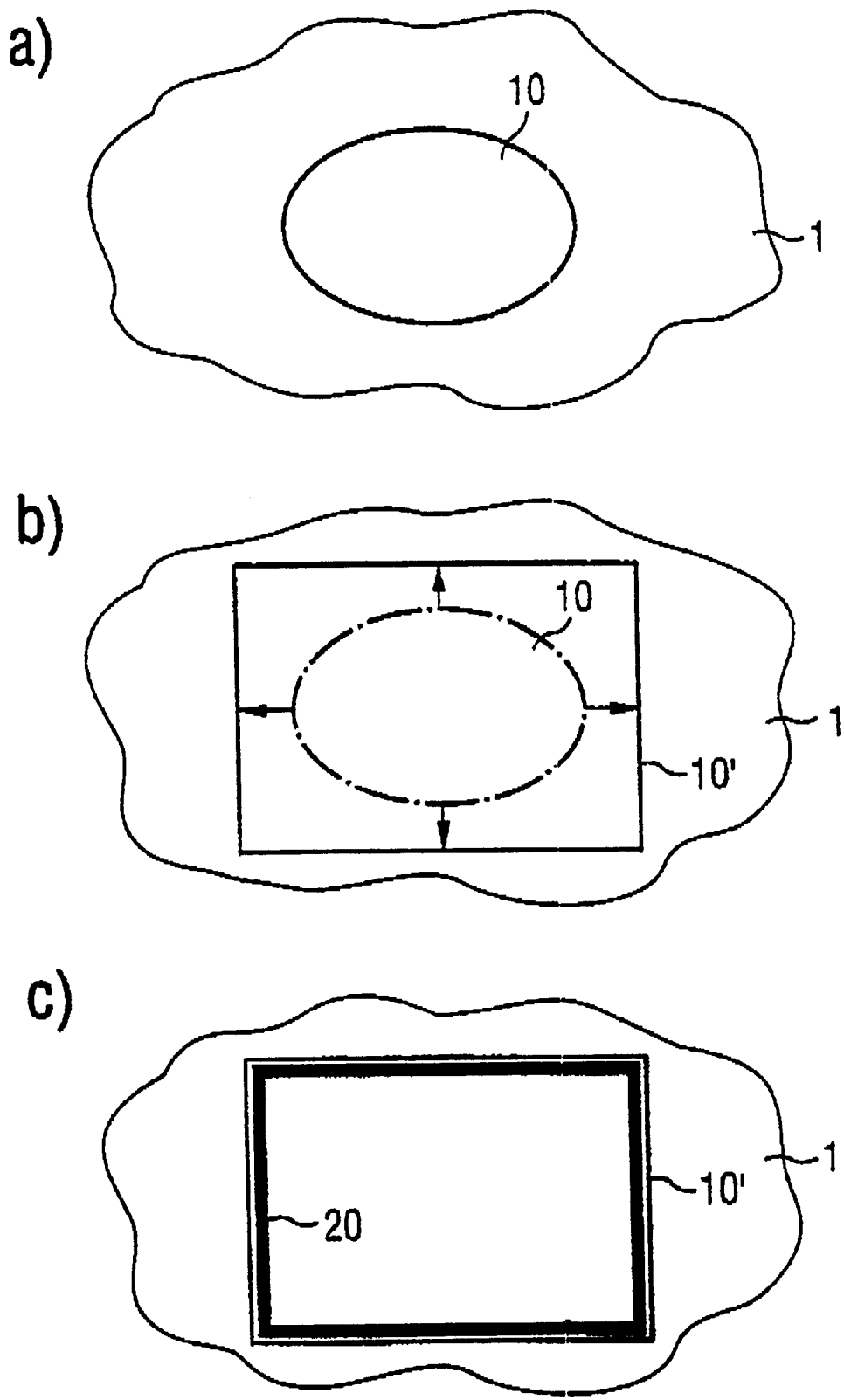
FIGS. 1a–1c show a diagrammatic illustration of the essential method steps for fabricating a semiconductor component as one embodiment of the present invention.

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

A high surface charge density is produced while complying with the leakage current specifications in the DRAM capacitor by using specific materials having a high relative permittivity.

In accordance with one preferred development, the binary metal oxide is an oxide of a rare earth metal.

In accordance with a further preferred development, the oxide is selected from the following group: $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Tm_2O_3$, $Er_2O_3$, $Yb_2O_3$, $Lu_2O_3$.

In accordance with a further preferred development, the binary metal oxide is an oxide of a transition metal.

In accordance with a further preferred development, the oxide is selected from the following group; $Al_2O_3$, $HfO_2$, $ZrO_2$, $Sc_2O_3$, $Y_2O_3$, $La_2O_3$, BeO, MgO, CaO, SrO, $Li_2O$.

In accordance with a further preferred development, the semiconductor component is a plate capacitor or a trench capacitor with the construction electrode layer/dielectric layer/electrode layer, the electrode layers being metal layers or (poly)silicon layers.

In accordance with a further preferred development, the semiconductor component is a trench capacitor, the dielectric being grown epitaxily in the trench.

In FIGS. 1a–1c, identical reference symbols designate identical or functionally identical elements.

Generally, one preferred embodiment proposes materials which, in contact with silicon, can expect a good thermostability, as dielectrics for DRAM storage capacitors with SIS or alternatively MSIS, MIS and MIM structure (S=silicon, I=dielectric, M=metal).

In this case, these dielectric layers may have the following structural properties:

Deposition amorphous → after heat treatment amorphous

Deposition amorphous → after heat treatment (poly) crystalline

Deposition (poly) crystalline → after heat treatment (poly) crystalline

Deposition epitaxial → after heat treatment epitaxial

Deposition epitaxial → after heat treatment (poly) crystalline

The following materials and their mixtures or nanolaminates are considered as thermostable dielectric:

Oxides of rare earths:
$Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$ Transition metal oxides:
$Al_2O_3$, $HfO_2$, $ZrO_2$, $Sc_2O_3$, $Y_2O_3$, $La_2O_3$, BeO, MgO, CaO, SrO, $Li_2O$ The deposition can be effected, in principle, by sputtering, vapor deposition, molecular beam epitaxy, CVD (chemical vapor deposition) or ALCVD (atom layer chemical vapor deposition) methods, if appropriate with plasma or remote plasma enhancement. ALCVD and CVD, in particular, are appropriate for structures with high aspect ratios. As an alternative, it is also possible first to deposit the associated metal, which is then converted into the oxide by suitable oxidation.

It is advantageous, specifically in the case of an SIS or SIM capacitor in the trench, that high-temperature processes are also possible during the deposition and/or during temperature steps that may follow. Therefore, depositions at elevated temperature are also appropriate there. In particular, layers can then be grown in a crystalline manner, in an oriented manner or even epitaxily.

In order to support epitaxial growth in the trench, it is expedient to provide trench walls of a uniform orientation. For that purpose, it is possible to use known (wet) etching methods, which etch specific crystallographic directions more rapidly than others (preferred orientations). Trenches of rectangular (or square) cross section can be produced in this way. The sidewalls of such trenches have a uniform orientation (e.g.). The latter process will now be explained in more detail with reference to FIGS. 1a–c.

With reference to FIG. 1a, first a trench 10 is formed by a known method in a silicon substrate 1, which serves as a first capacitor electrode. The method may be, for example, reactive ion etching using a corresponding oxide hard mask.

With reference to FIG. 1b in a subsequent step, a wet etching method is employed in order to produce a widened trench 10' with modified trench walls with a predetermined crystal orientation. The crystal orientation is in the present case.

In a subsequent step, a dielectric layer 20 e.g. made of $Pr_2O_3$, $Nd_2O_3$ or other of the materials mentioned is grown in an oriented manner on the trench walls with a predetermined crystal orientation thus prepared.

In a further process step (not shown) the modified trench 10' with the dielectric layer 20 is filled with polysilicon, which forms a second capacitor electrode. It is thus possible to produce a capacitor with a high surface charge density while complying with the leakage current specifications for the DRAM memories.

While a preferred embodiment has been illustrated and described in detail in the drawings and foregoing description, the same is to be considered as illustrative and not restrictive in character, it being understood that only the preferred embodiment has been shown and described and that all changes and modifications that come within the spirit of the invention both now or in the future are desired to be protected.

We claim as our invention:

1. A method for fabricating a semiconductor component, comprising the steps of:

providing a substrate; and in the substrate Providing a trench capacitor by providing a first trench in the substrate by a first etching process, the substrate being a first electrode layer of the capacitor, subjecting trench walls of the trench to a second etching process to change crystal orientation and thus create a widened trench with modified trench walls having a predetermined crystal orientation, providing a dielectric layer on the substrate by first depositing into the trench a metal which is then oxidized in a thermal process so that the dielectric layer comprises a binary metal oxide, and then providing a second electrode layer on the dielectric layer.

2. The method according to claim 1 wherein the binary metal oxide comprises an oxide of a rare earth metal.

3. The method according to claim 1 wherein the binary metal oxide comprises an oxide of a transition metal.

4. The method for fabricating a semiconductor component according to claim 1, wherein the dielectric layer is deposited by at least one of the following methods: sputtering, vapor deposition, molecular beam epitaxy, CVD (chemical vapor deposition), and ALCVD (atomic layer chemical vapor deposition).

5. A method of claim 4 wherein the method includes plasma enhancement.

6. The method according to claim 5, wherein the plasma enhancement comprises remote plasma enhancement.

7. The method for fabricating a semiconductor component according to claim 1 wherein the dielectric layer is deposited in one of a crystalline manner, in an oriented manner, and epitaxial in a high-temperature step.

8. The method for fabricating a semiconductor component according to claim 1, wherein the dielectric layer is grown on the modified trench walls in an oriented manner.

9. The method according to claims 1 wherein the semiconductor component is a trench capacitor, the dielectric being grown epitaxily in the trench.

10. A method for fabricating a semiconductor trench capacitor component, comprising the steps of:

providing a substrate comprising a first capacitor electrode;

providing a trench in the substrate in a first etching process:

subjecting trench walls of the trench to a second etching process which changes crystal orientation and thus creates a widened trench with modified trench walls having a predetermined crystal orientation;

providing a dielectric layer on the substrate by first depositing a metal onto the substrate which is then oxidized in a thermal process so that the dielectric layer comprises a binary metal oxide, the dielectric layer being epitaxily grown in the trench; and filling the trench on top of the dielectric layer with polysilicon to form a second capacitor electrode.

11. A method for manufacturing a dielectric layer as an insulator layer for a trench capacitor, comprising the steps of:

providing a substrate as a first electrode layer of said trench capacitor;

forming a trench in said substrate by a first etching process;

subjecting the trench walls to a second etching process which change crystal orientation and provides a broadened trench with modified trench walls having a predetermined crystalline orientation; and orientedly growing said dielectric layer on said modified trench walls having said predetermined crystalline orientation, said dielectric layer being a binary metal oxide.

* * * * *